United States Patent
Ye et al.

(10) Patent No.: US 9,634,415 B2
(45) Date of Patent: Apr. 25, 2017

(54) DEVICE FOR COUPLING A PLC BUS

(71) Applicant: Siemens Aktiengesellschaft, München (DE)

(72) Inventors: Wenmin Ye, Johnson City, TN (US); Ned Cox, Gray, TN (US)

(73) Assignee: SIEMENS AKTIENGESELLSCHAFT, München (DE)

( * ) Notice: Subject to any disclaimer, the term of this patent is extended or adjusted under 35 U.S.C. 154(b) by 0 days.

(21) Appl. No.: 14/912,421

(22) PCT Filed: Sep. 27, 2013

(86) PCT No.: PCT/US2013/062076
§ 371 (c)(1),
(2) Date: Feb. 17, 2016

(87) PCT Pub. No.: WO2015/047286
PCT Pub. Date: Apr. 2, 2015

(65) Prior Publication Data
US 2016/0204535 A1    Jul. 14, 2016

(51) Int. Cl.
*H01R 12/00* (2006.01)
*H01R 13/17* (2006.01)
(Continued)

(52) U.S. Cl.
CPC .......... *H01R 13/17* (2013.01); *H01R 9/2658* (2013.01); *H01R 43/205* (2013.01); *H01R 43/26* (2013.01);
(Continued)

(58) Field of Classification Search
CPC .. H01R 13/2421; H01R 13/17; H01R 12/716; H01R 9/2658; H01R 13/10; H01R 43/26;
(Continued)

(56) References Cited

U.S. PATENT DOCUMENTS 6,038,130 A    3/2000  Boeck et al.
6,477,593 B1 *  11/2002  Khosrowpour ..... G06F 13/4027
                                                    361/790
(Continued)

FOREIGN PATENT DOCUMENTS

EP    1041478 A2    10/2000
GB    413030 A    7/1934
(Continued)

OTHER PUBLICATIONS

PCT International Search Report mailed Jun. 12, 2014 corresponding to PCT Application No. PCT/US2013/062076 filed Sep. 27, 2013 (10 pages).

*Primary Examiner* — Jean F Duverne

(57) ABSTRACT

In order to facilitate the vertical placement of modules (104, 106) within a PLC (100) and thus decrease the size of the PLC (100) without reducing the capability of the PLC (100), modules (104, 106) of the PLC (100) each includes a printed circuit board (PCB) (200, 202, 204), a spring loaded pin connector (214) supported by and in electrical communication with a first surface (206, 208) of the PCB (200, 202, 204), and a receptacle (216) supported by and in electrical communication with a second surface (206, 208) of the PCB (200, 202, 204). The spring loaded pin connector (214) and the receptacle (216) are in electrical communication with each other via the PCB (200, 202, 204).

20 Claims, 5 Drawing Sheets

(51) Int. Cl.
*H01R 9/26* (2006.01)
*H01R 43/20* (2006.01)
*H01R 43/26* (2006.01)
*H05K 7/14* (2006.01)
*H01R 12/71* (2011.01)
*H01R 13/10* (2006.01)
*H01R 13/24* (2006.01)

(52) U.S. Cl.
CPC ......... *H05K 7/1435* (2013.01); *H05K 7/1478* (2013.01); *H01R 12/716* (2013.01); *H01R 13/10* (2013.01); *H01R 13/2421* (2013.01)

(58) Field of Classification Search
CPC ... H01R 43/205; H05K 7/1435; H05K 7/1478
USPC .......................................................... 439/66
See application file for complete search history.

(56) References Cited

U.S. PATENT DOCUMENTS

| | | | | |
|---|---|---|---|---|
| 8,743,554 B2* | 6/2014 | Russell | ................... | H05K 1/023 361/761 |
| 9,017,081 B2* | 4/2015 | Ueyama | ............. | H01R 12/7076 439/64 |
| 9,039,448 B2* | 5/2015 | Mason | ............. | H01R 13/65807 439/607.09 |
| 9,049,789 B2* | 6/2015 | Ohsawa | ................ | H05K 1/0296 |
| 2001/0016436 A1* | 8/2001 | Wimmer | ............... | H01R 43/007 439/66 |
| 2002/0127895 A1 | 9/2002 | Schnatwinkel et al. | | |
| 2003/0040201 A1* | 2/2003 | Ishizuka | ............. | H01R 13/2421 439/66 |
| 2003/0156443 A1* | 8/2003 | Moriarty | ................... | G11C 5/04 365/63 |
| 2005/0073813 A1* | 4/2005 | Meyer | .................... | H05K 3/301 361/704 |
| 2005/0253602 A1* | 11/2005 | Cram | ................. | G01R 1/06722 324/754.09 |
| 2006/0116004 A1* | 6/2006 | Rathburn | ........... | H01R 13/2435 439/66 |
| 2007/0170935 A1* | 7/2007 | Huang | ............... | G01R 31/2889 324/754.03 |

FOREIGN PATENT DOCUMENTS

GB 2267608 A 12/1993
TW M444669 U 1/2013

* cited by examiner

DEVICE FOR COUPLING A PLC BUS

BACKGROUND

Industrial control systems may be used for monitoring parameters and/or controlling devices. Within industrial control systems, one or more sensors may be communicatively coupled to a programmable logic controller (PLC) via one or more input/output (I/O) modules (e.g., a communication module). Via one of the I/O modules, the PLC may control one or more devices such as, for example, a rheostat, a switch, a sequencer, a servo drive, a motor, and/or a valve.

I/O modules of the PLC may be connected to each other and/or to a central processing unit (CPU) of the PLC with, for example, cables and corresponding connectors (e.g., ribbon cables and insulation-displacement connectors). The PLC housing is designed to enclose the modules and the connecting cables. Due to the use of the cables and corresponding connectors for connecting the I/O modules, the I/O modules of the PLC are disposed horizontally within the PLC housing and are positioned end to end.

SUMMARY

In order to facilitate the vertical placement of modules within a PLC and thus decrease the size of the PLC without reducing the capability of the PLC, modules of the PLC each includes a printed circuit board (PCB), a spring loaded pin connector supported by and in electrical communication with a first surface of the PCB, and a receptacle supported by and in electrical communication with a second surface of the PCB. The spring loaded pin connector and the receptacle are in electrical communication with each other via the PCB.

In a first aspect, a module for a PLC is provided. The module includes a PCB. The PCB includes two opposing sides. The module also includes a first connector assembly supported by one of the two opposing sides of the PCB. The first connector assembly includes a housing and a spring loaded pin connector disposed in the housing. The module also includes a second connector assembly supported by the other of the two sides of the PCB. The second connector assembly includes a female connector. At least part of the spring loaded pin connector is in electrical communication with at least part of the female connector via the PCB.

In a second aspect, a controller includes a first module and a second module. The first module includes a first PCB including two opposing sides. The first module also includes a male connector supported by one of the two opposing sides of the first PCB. The male connector includes a housing and a spring loaded pin connector disposed in the housing. The spring loaded pin connector includes a spring and a pin. The pin abuts an end of the spring. The spring is operable to move the pin relative to the housing of the male connector. The second module includes a second PCB including two opposing sides. The second module also includes a female connector supported by one of the two opposing sides of the second PCB. The female connector includes a receptacle. The receptacle includes an opening extending at least partially through the receptacle. A portion of the pin of the spring loaded pin connector of the first module is sized and shaped such that the pin is mateable with the receptacle.

In a third aspect, a method of manufacturing a programmable logic controller (PLC) is provided. The method includes attaching a male connector to a surface of a first PCB such that the male connector is in electrical communication with the first PCB. The male connector includes a housing and a spring loaded pin connector disposed in the housing. The spring loaded pin connector includes a spring and a pin. The pin abuts an end of the spring. The spring is operable to move the pin relative to the housing. The method also includes attaching a female connector to a surface of a second PCB, such that the female connector is in electrical communication with the second PCB. The female connector includes a receptacle. The receptacle includes an opening extending at least partially through the receptacle. The method includes positioning the male connector of the first PCB and the female connector of the second PCB relative to each other such that the pin of the spring loaded pin connector of the male connector moves into the opening extending through the receptacle of the female connector.

DETAILED DESCRIPTION

A programmable logic controller (PLC) BUS coupling design affects the overall size of the PLC. In order to provide full hardware functionality while also reducing the size of the PLC compared to PLCs of the prior art, the PLC BUS coupling of one or more of the present embodiments includes a spring loaded POGO pin connector and a corresponding receptacle.

The spring loaded POGO pin connector allows printed circuit boards (PCBs) to be placed vertically in the modules (e.g., I/O modules, communication modules, or a central processing unit (CPU) module) of the PLC. The vertically placed PLC modules efficiently utilize space within the PLC, thus reducing the overall size of the PLC.

Figure 1:
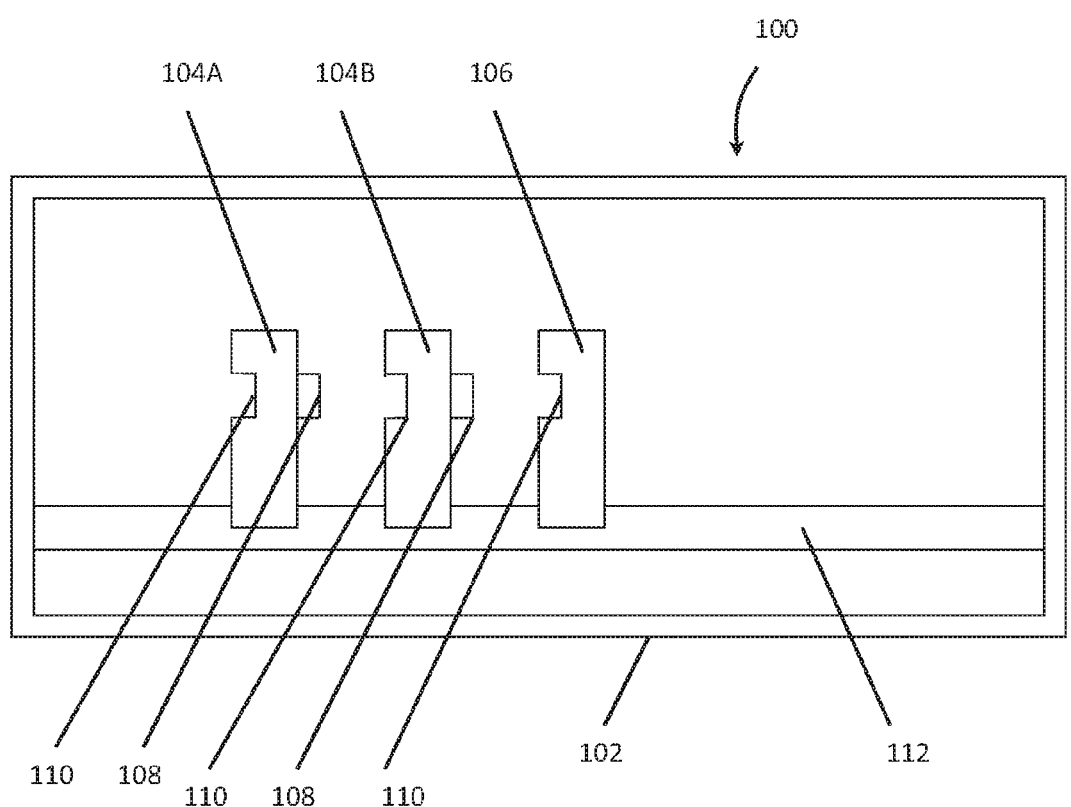
FIG. 1 shows one embodiment of a programmable logic controller (PLC)

FIG. 1 shows one embodiment of a PLC 100 including a housing 102 with one side of the housing 102 removed or not shown in order to provide a view of the internal modules. The PLC 100 is a digital computer used for automation of processes such as, for example, the control of machinery. The PLC 100 includes a plurality of modules 104 (e.g., two modules; input/output (I/O) modules) that are communicatively coupled to one or more sensors (not shown) and/or one or more components of the machinery (e.g., actuators of the one or more components). The one or more sensors may measure parameters within or used for control of the machinery including, for example, temperature, pressure, position, and/or any number of other analog process variables. Alternatively or additionally, the one or more sensors may read limit switches of the machinery. The one or more components of the machinery may include, for example, a rheostat, a switch, a sequencer, a servo drive, a motor, a cylinder, a magnetic relay, a solenoid, an analog output, a valve, and/or any other electrically controllable device. The I/O modules 104 receive data from the one or more sensors, process the data received from the one or more sensors, and/or transmit data (e.g., control data) to the one or more components of the machinery.

Each of the I/O modules 104 includes one or more electrical components supported by and in communication with a printed circuit board at least partially disposed within a housing of the I/O module 104. The one or more electrical components of the I/O module 104 are used to receive the data from the one or more sensors, process the data received from the one or more sensors, and/or transmit the control data to the one or more components of the machinery. The one or more electrical components may include, for example, a general processor, a control processor, a digital signal processor, an application-specific integrated circuit, a field-programmable gate array, a digital circuit, an analog circuit, memory, switches, interfaces, capacitors, inductors, resistors, transistors thermal management devices (e.g., heat sinks and/or heat pipes), other components, or a combination thereof.

The PLC 100 also includes a module 106 including a central processing unit (CPU) supported by a printed circuit board (not shown) at least partially disposed within a housing. The I/O modules 104 may transmit the data received from the one or more sensors to the module 106. The CPU of the module 106 calculates control data for the one or more components of the machinery to automatically control, for example, the machinery.

Alternatively or additionally to the CPU, the module 106 may include a general processor, a control processor, a digital signal processor, an application-specific integrated circuit, a field-programmable gate array, a digital circuit, an analog circuit, combinations thereof, or other now known or later developed device. The CPU is a single device or multiple devices operating in serial, parallel, or separately. The CPU is configured by instructions, design, hardware, and/or software to, for example, control the machinery or components of the machinery. The module 106 may include any number of other electrical components in communication with the CPU including, for example, memory, switches, interfaces, capacitors, inductors, resistors, transistors, thermal management devices (e.g., heat sinks and/or heat pipes), and other components.

Other modules may be provided. For example, the control module 106 is provided as two separate modules operating in parallel, sequence, or independently. Modules for other purposes may be provided.

The modules 104, 106 are in communication with each other via male connectors 108 and female connectors 110. The male connectors 108 and the female connectors 110 are operable to transmit power signals and/or data signals, for example, between the modules 104, 106. For example, signals received from a sensor in communication with a first module 104A (e.g., the left most module in FIG. 1) may be transmitted to the CPU of the module 106 for processing via the PCB and the male connector 108 of the first module 104A, the female connector 110, the PCB, and the male connector 108 of a second module 104B (e.g., the center module 104), and the female connector 110 and the PCB of the module 106. Alternatively or additionally, control signals generated by the CPU may be transmitted to, for example, an actuator in communication with the second module 104B via the PCB and the female connector 110 of the module 106, and the male connector 108 and the PCB of the second module 104B. The signals may be routed through one or more modules, including the corresponding PCBs and mated connectors.

Each module 104 may include one male connector 108 and one female connector 110. For example, the one male connector 108 may be disposed on a first side of the module 104, and the one female connector 110 may be disposed on a second side of the module 104. In one embodiment, a first portion of the modules 104 includes only male connectors 108, and a second portion of the modules 104 includes only female connectors 110. In another embodiment, as shown in FIG. 1, one or more of the modules 104 may include only a single connector (e.g., only a male connector 108 or only a female connector 110).

The housings of the modules 104, 106 may provide structural support for the PCBs of the modules 104, 106. The PCBs of the modules 104, 106 may be attached to the housings of the modules 104, 106 in any number of ways including, for example, with fasteners (e.g., screws), extensions (e.g., flanges and/or ribs) and/or an adhesive. The housing of the module 106 may include one or more openings through which one or more cables (e.g., for power), for example, extend. The housings of the modules 104, 106 may be made of any number of materials including, for example, a dielectric plastic. In one embodiment, the modules 104, 106 do not include housings.

The housings of the modules 104 may include openings through which the male connectors 108 and the female connectors 110 extend, such that, for example, the male connector 108 of the first module 104A may mate with the female connector 110 of the second module 104B. For the second module 104B, for example, the male connector 108 extends away from a first outer surface of the housing of the second module 104B, and the female connector 110 is recessed relative to a second outer surface of the housing of the second module 104B.

In one embodiment, the modules 104, 106 are slidably attached to a rail 112 positioned within the housing 102 of the PLC 100. The modules 104, 106 may also be removably attached to the rail 112 such that different modules may be installed in the PLC 100 for different applications. The male connectors 108 and the female connectors 110 may be sized and positioned on the respective modules 104, 106 such that when a module 104, 106 (e.g., the first module 104A) is slid along the rail 112 into abutment with another module 104, 106 (e.g., the second module 104B), the male connector 108 of the first module 104A, for example, moves into connection with the female connector 110 of the second module 104B, for example.

The housings of the modules 104, 106 may also include locking mechanisms, such that when the male connector 108 of the first module 104A, for example, moves into connection with the female connector 110 of the second module 104B, for example, the locking mechanisms of the first module 104A and the second module 104B fix a relative distance between the first module 104A and the second module 104B. The connectors 108, 110 may include the locking mechanism, or the module housing may include the locking mechanism.

In one embodiment, the male connectors 108 and the female connectors 110 are positioned at the same location on the PCBs of all of the modules 104, 106 relative to the rail 112 (e.g., height above the rail 112). In other embodiments, mating pairs of male connectors 108 and female connectors 110 are positioned at the same location on the PCBs of mating modules 104, 106 relative to the rail 112, but different mating pairs may be at different positions relative to the rail 112. The male connectors 108 and the female connectors 110 of the modules 104, 106 allow the PCBs of the modules 104, 106 to be placed vertically within the modules 104, 106. The vertical arrangement of the PCBs of the modules 104, 106 efficiently utilizes space within the PLC 100, thus reducing the overall size of the PLC 100.

FIG. 1 shows three modules 104, 106. In other embodiments, the PLC 100 may include more or fewer modules 104, 106. In one embodiment, the PLC 100 includes the module 106 and seven I/O modules 104.

Figure 2:
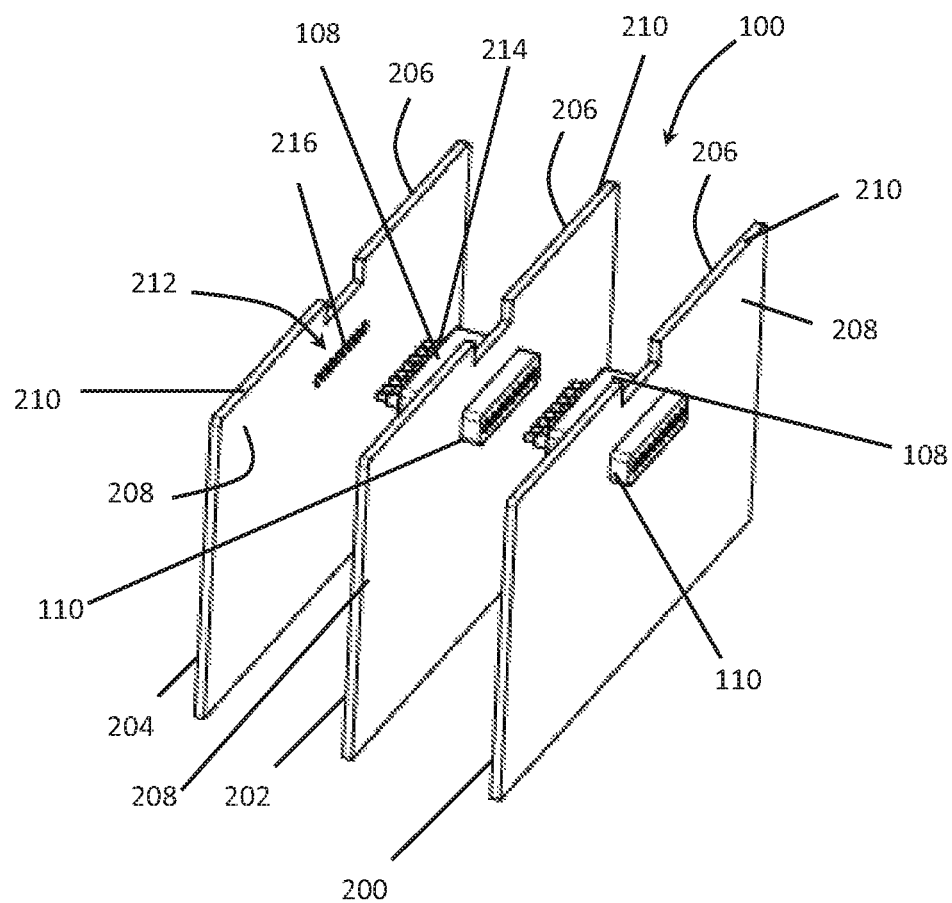
FIG. 2 shows a first isometric view of one embodiment of modules of a PLC.

FIG. 2 shows a first isometric view of exemplary embodiments of three modules 104, 106 of a PLC 100 with housings of the modules 104, 106 removed. The first I/O module 104A (e.g., the rightmost module in FIG. 2) includes a first PCB 200, the second I/O module 104B (e.g., the center module in FIG. 2) includes a second PCB 202, and the module 106 includes a third PCB 204. Each of the first PCB 200, the second PCB 202, and the third PCB 204 supports and electrically connects the electrical components of the respective module 104, 106. The electrical components are electrically connected using conductive tracks, pads, and other features, for example, etched from copper sheets of or deposited in the respective PCB 200, 202, or 204. The copper sheets of the PCB 200, 202, or 204 are, for example, laminated onto a non-conductive substrate. Other configurations of PCBs (e.g., other materials) may be used.

The first PCB 200, the second PCB 202, and the third PCB 204 (e.g., PCBs) may each include two opposing sides 206 and 208 (e.g., a top 206 and a bottom 208), and one or more sides 210. The PCBs 200, 202, 204 may, for example, be rectangular in shape. In other embodiments, the PCBs 200, 202, 204 may be other shapes (e.g., circular). The PCBs 200, 202, 204 may have any dimensions (e.g., length, width, and thickness) depending on the application of the PLC 100. For example, the length, the width, and the thickness of the PCBs 200, 202, 204 may be greater for applications requiring higher processing power (e.g., the control of more complex machinery), as the number and size of electrical components used may be greater, and the number of etched copper sheets used may be greater for such an application.

The first PCB 200 and the second PCB 202 may each support and may each be in electrical communication with a male connector 108 and a female connector 110. For example, the first PCB 200 and the second PCB 202 each support a male connector 108 on the top 206 of the PCB 200, 202 and a female connector 110 on the bottom 208 of the PCB 200, 202. Alternatively, the positioning may be reversed (e.g., the male connector 108 is disposed on the bottom 208 of the PCB 200, 202, and the female connector 110 is disposed on the top 206 of the PCB 200, 202). The male connector 108 and the female connector 110 on each of the first PCB 200 and the second PCB 202 are in electrical communication via the conductive tracks, the pads, and the other features of the first PCB 200 and the second PCB 202, respectively. The electrical connection is direct, such as one pin connected by a conductor to another trace, or indirect, such as being electrically connected through one or more components (e.g., a circuit and/or processor). In one embodiment, the male connector 108 and the female connector 110 may be soldered to pads on the top 206 and the bottom 208 of the PCB 200, 202, respectively. In other embodiments, the male connector 108 and the female connector 110 may be connected to other components of the PCB 200, 202 and/or may be connected to the pads on the top 206 and the bottom 208 of the PCB 200, 202 in a different way. In one embodiment, one of the I/O modules 104 may include only a male connector 108 or only a female connector 110.

The third PCB 204 may support and may be in electrical communication with a female connector 212. For example, the third PCB 204 supports the female connector 212 on the bottom 208 of the third PCB 204. In the embodiment shown in FIG. 2, the third PCB 204 does not support a male connector 108, as the third PCB 204 supports and is in electrical communication with the CPU (not shown). In other embodiments, the third PCB 204 only supports a male connector 108 (e.g., the third PCB 204 does not support the female connector 212) on the top 206 or the bottom 208 of the third PCB 204, the third PCB 204 supports a male connector 108 on the top 206 of the third PCB 204 in addition to the female connector 212 supported on the bottom 208 of the third PCB 204, or the positioning of the connectors is reversed (e.g., the male connector 108 is disposed on the bottom 208 of the third PCB 214, and the female connector 212 is disposed on the top 206 of the PCB 204).

The CPU supported by the third PCB 204 is in electrical communication with the female connector 212 via the conductive tracks, the pads, and the other features of the third PCB 204. In one embodiment, the female connector 212 may be soldered to pads on the bottom 208 of the third PCB 206. In other embodiments, the female connector 212 may be connected to other components of the third PCB 204 and/or may be connected to the pads on the bottom 208 of the third PCB 204 in a different way.

The male connector 108 may be a spring loaded pin connector (e.g., a spring loaded POGO pin connector). The spring loaded pin connector 108 may include a housing (discussed below) and any number of spring loaded pins 214 disposed in the housing. For example, as shown in FIG. 2, the spring loaded pin connector 108 may include a single row of eight pins 214. The spring loaded pin connector 108 may include more or fewer pins 214. In other embodiments, the pins 214 may be positioned in a plurality of rows (e.g., two or three rows of pins 214). The number of pins 214 may be determined based on the number of modules housed in the PLC 100, the number of sensors from which the PLC 100 receives data, and/or the number of actuators, for example, to be controlled by the PLC 100. Less than all of the pins 214 of the male connector 108 may transmit signals during operation of the PLC 100. For example, the PLC 100 may be expandable to include up to seven I/O modules 104, but certain applications may not require the maximum number of I/O modules 104. The spring loaded pin connectors 108 may transmit power signals and/or data signals. Other male connectors may be used.

The female connector 110 may include one or more receptacles 216, into which the spring loaded pin 214 of the male connector 108 are positioned to provide an electrical connection. The number of receptacles 216 of the female connector 110 may match the number of pins 214 of the male connector 108 to which the respective female connector 110 is to mate. For example, in the embodiment shown in FIG. 2, the male connector 108 of the first PCB 200 includes eight spring loaded pins 214. Accordingly, the female connector 110 of the second PCB 202, to which the male connector 108 of the first PCB 200 connects, includes eight receptacles 216. In other embodiments, the female connector 110 includes more or fewer receptacles 216.

The female connector 212 of the third PCB 204 is an alternative embodiment of the female connector 110. The female connector 110 includes a housing (discussed below) in which the receptacles 216 are disposed. The female connector 212 does not include a housing, and the receptacles 216 are attached directly to, for example, pads on the bottom 208 of the third PCB 204. In one embodiment, all of the female connectors are the same for all of the modules 104, 106 (e.g., female connectors 110 or female connectors 212).

FIG. 2 shows three PCBs 200, 202, 204. In other embodiments, the PLC 100 may include more or fewer PCBs. The number of PCBs may correspond to the number of modules in the PLC 100. Alternatively, one or more of the modules may house more than one PCB.

Figure 3:
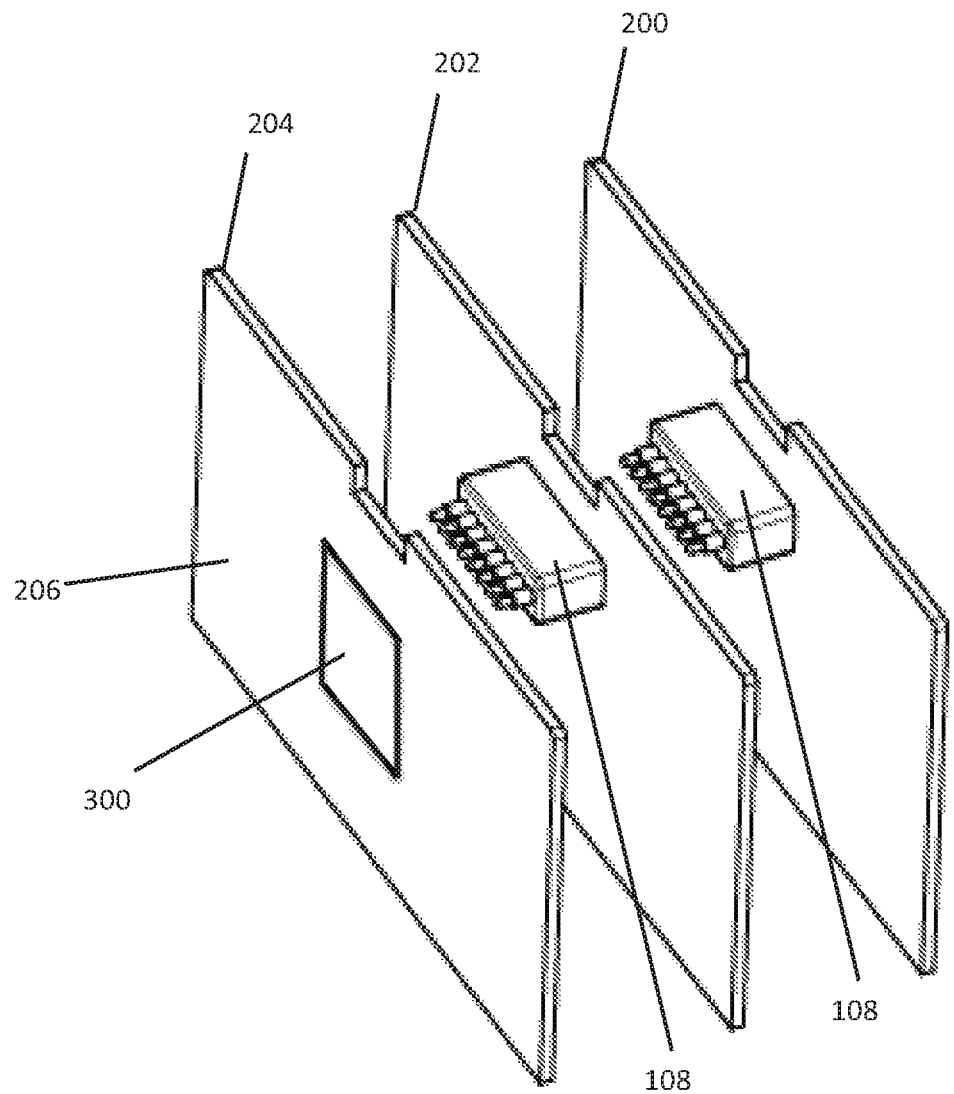
FIG. 3 shows a second isometric view of the modules of the PLC of FIG. 2.

FIG. 3 shows a second isometric view of the modules of the PLC of FIG. 2. FIG. 3 shows the first PCB 200, the second PCB 202, and the third PCB 204 from a different perspective. The top 206 of the third PCB 204 supports, for example, a CPU 300. The CPU 300 is in communication with the second PCB 202 via the conductive components of the third PCB 204, the female connector 212 of the third PCB 204 (shown in FIG. 2), and the male connector 108 of the second PCB 202. The second PCB 202 is in communication with the first PCB 200 via the female connector 110 of the second PCB 202 (shown in FIG. 2) and the male connector 108 of the first PCB 200.

Figure 4:
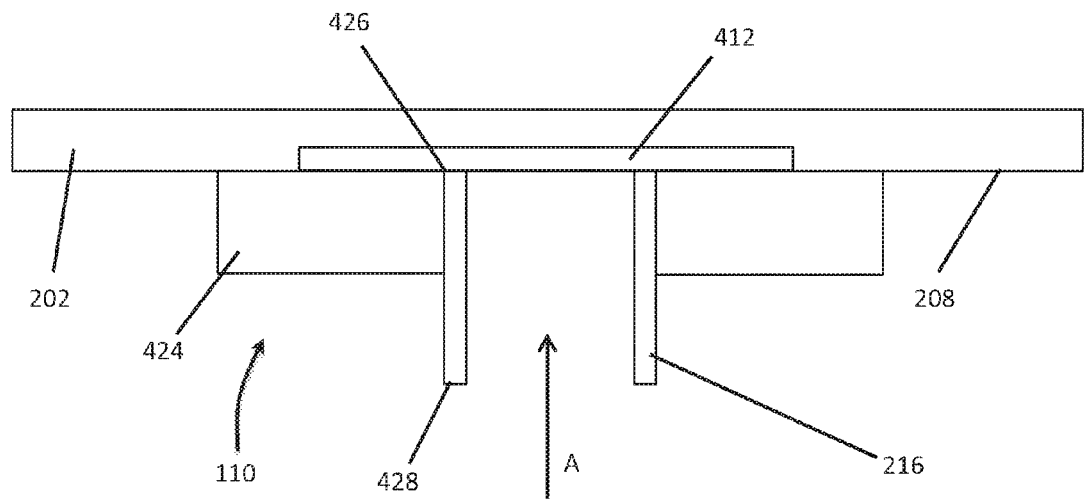
FIG. 4 shows one embodiment of a coupling between modules of a PLC.
Figure 4:
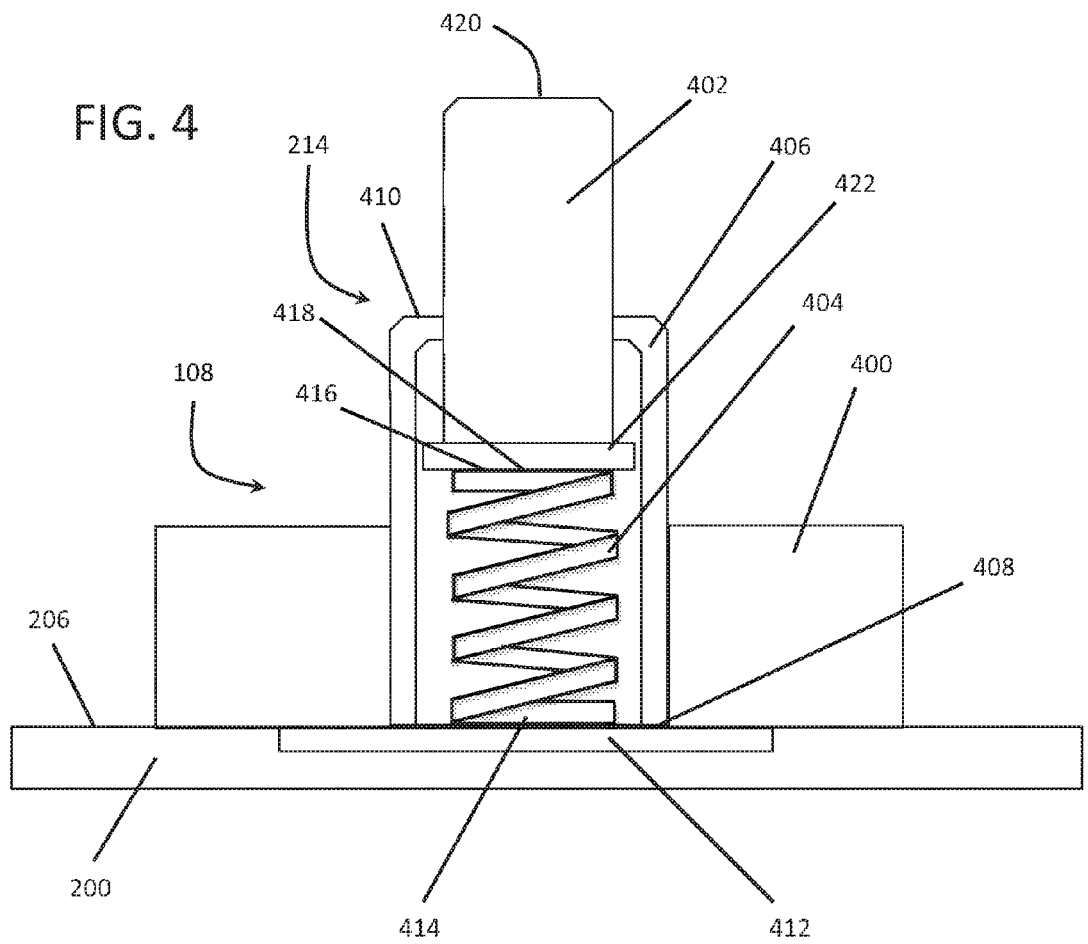

FIG. 4 shows a cross-section view of one embodiment of a coupling between modules of a PLC. The coupling includes a portion of the male connector 108 of, for example, the first PCB 200 and a portion of the female connector 110 of, for example, the second PCB 202. The portion of the male connector 108 shown in FIG. 4 includes one spring loaded pin 214 and a housing 400. The spring loaded pin 214 extends through an opening in the housing 400. The spring loaded pin 214 may be attached to the housing 400 in any number of ways (e.g., friction fit, adhered to the housing 400 along a portion of the length of the spring loaded pin 214, fit in a slot with prongs or other limiters). The spring loaded pin 214 of FIG. 4 may be one of a plurality of spring loaded pins 214 (e.g., eight spring loaded pins, as shown in FIGS. 2 and 3). The housing 400 is attached to the top 206 of the first PCB 200, for example, in any number of ways including, for example, with an adhesive or with a screw.

The spring loaded pin 214 includes a pin 402, a spring 404, and a spring housing 406 (e.g., a barrel). The barrel 406 includes a first end 408 and a second end 410. An opening extends through the barrel 406 from the first end 408 to the second end 410 (e.g., the barrel 406 is hollow). An opening through the first end 408 is larger than an opening through the second end 410. The barrel 406 may be any number of shapes including, for example, cylindrical. The first end 408 of the barrel 406 may be in electrical communication with the first PCB 200, for example, via a pad 412 of the first PCB 200. The first end 408 of the barrel 406 may be attached to the pad 412 of the first PCB 200 with, for example, solder. The first end 408 of the barrel 406 may be attached to the pad 412 of the first PCB 200 in any number of other ways. The first end 408 of the barrel 406 may include an extension (e.g., a flange) to facilitate the attachment of the barrel 406 to the pad 412 of the first PCB 200. The spring loaded pin 214 is attached to the housing 400 of the male connector 108 via the barrel 406 of the spring loaded pin 214. For example, a portion of an outer surface of the barrel 406 is attached to the housing 400 of the male connector 108.

The barrel 406 houses the spring 404. For example, when the male connector 108 is attached to the first PCB 200, the spring 404 is housed entirely within the barrel 406. The spring 404 includes a first end 414 and a second end 416. The first end 414 of the spring 404 remains in contact with the pad 412 of the first PCB 200 throughout operation of the spring loaded pin 214. The second end 416 of the spring 404 abuts a portion of the pin 402.

The spring 404 is a coil spring. The stiffness of the spring 404 may be selected based on how tight of a fit between the male connector 108 and the female connector 110 is to be provided. Other springs may be used.

The pin 402 includes a first end 418 and a second end 420. At the first end 418, the pin 402 may include an extension 422 (e.g., a flange). The maximum diameter of the flange 422 is greater than the diameter of the opening at the second end 410 of the barrel 406 such that a portion of the pin 402 (e.g., the flange 422 of the pin 402) remains housed within the barrel 406 when the spring 404 is extended. When the spring 404 is extended, the flange 422 abuts a portion of the barrel 406 adjacent to the second end 410 of the barrel 406.

The pin 402 may be any number of shapes including, for example, cylindrical. The maximum diameter of the pin 402 is less than a minimum internal diameter of the barrel 406 such that the pin 402 is free to move within the barrel 406 of the spring loaded pin 214. The pin 402 may be any number of diameters. For example, the diameter of the pin 402 may be set based on the amount of maximum current that is to flow through the corresponding spring loaded pin 214. Pins of different spring loaded pins 214 may have different diameters within the same male connector 108. The second end 420 of the pin 402 may include a tapering to facilitate mating between the male connector 108 of the first PCB 200 and the female connector 110 of the second PCB 202, for example. The pin 402 may be a piece of solid material. Alternatively, the pin 402 may be hollow.

The pin 402 and the spring 404 are made of an electrically conductive material including, for example, gold plated copper. Additionally, the barrel 406 may be made of the same electrically conductive material (e.g., gold plated copper). The housing 400 of the male connector 108 may be made of an electrically insulating material including, for example, a dielectric plastic. Different materials may be used for the spring loaded pin 214 and/or the housing 400 of the male connector 108.

The portion of the female connector 110 shown in FIG. 4 includes one receptacle 216 and a housing 424. The receptacle 424 extends through an opening in the housing 424. The receptacle 216 may be attached to the housing 424 in any number of ways (e.g., friction fit or adhered to the housing 424 along a portion of the length of the receptacle 216). The receptacle 216 of FIG. 4 may be one of a plurality of receptacles 216 (e.g., eight receptacles as shown in FIGS. 2 and 3). The housing 424 is attached to the bottom 208 of the second PCB 202, for example, in any number of ways including, for example, with an adhesive or with a screw.

The receptacle 216 includes a first end 426 and a second end 428. An opening extends through the receptacle 216 from the first end 426 to the second end 428. The opening that extends through the receptacle 216 may have a constant diameter from the first end 426 to the second end 428 of the receptacle 216. The receptacle 216 may be any number of shapes including, for example, cylindrical. The opening that extends through the receptacle 216 may be sized and shaped to match the maximum diameter of the pin 402 of the spring loaded pin 214 such that the pin 402 forms a form fit (e.g., a friction fit) with the receptacle 216. The height of the receptacle 216 may be sized such that the second end 410 of the barrel 406 abuts the second end 428 of the receptacle 216 when the pin 402 is fully inserted into the receptacle 216 (e.g., the male connector 108 is fully mated with the female connector 110; the pin is moved in direction A into the receptacle 216). In another embodiment, the opening that extends through the receptacle 216 is sized and shaped to match the size and shape of the pin 402 when the pin 402 is fully mated with the receptacle 216. Other sizes and shapes may be used.

The first end 426 of the receptacle 216 may be in electrical communication with the second PCB 202, for example, via a pad 412 of the second PCB 202. The first end 426 of the receptacle 216 may be attached to the pad 412 of the second PCB 202 with, for example, solder. The first end 426 of the receptacle 216 may be attached to the pad 412 of the second PCB 202 in any number of other ways. The first end 426 of the receptacle 216 may include an extension (e.g., a flange) to facilitate the attachment of the receptacle 216 to the pad 412 of the second PCB 202.

The receptacle 216 is attached to the housing 424 of the female connector 110. For example, a portion of an outer surface of the receptacle 216 is attached to the housing 424 of the female connector 110. In one embodiment, as shown for the module 106 of FIG. 2, the female connector 110 does not include the housing 424, and the receptacles 216 are attached directly to the pad 412 or is the pad 412.

The receptacle 216 is made of an electrically conductive material including, for example, gold plated copper. The housing 424 of the female connector 110 may be made of an electrically insulating material such as, for example, a dielectric plastic. Different materials may be used for the receptacle 216 and/or the housing 424 of the female connector 110.

An electrical signal is transmitted from the first PCB 200 to the second PCB 202, for example, via the pad 412 on the first PCB 200, the spring 404 and the pin 402 of the spring loaded pin 214, the receptacle 216, and the pad 412 of the second PCB 202. Electrical signals may also be transmitted in the reverse from the second PCB 202 to the first PCB 200, for example.

Figure 5:
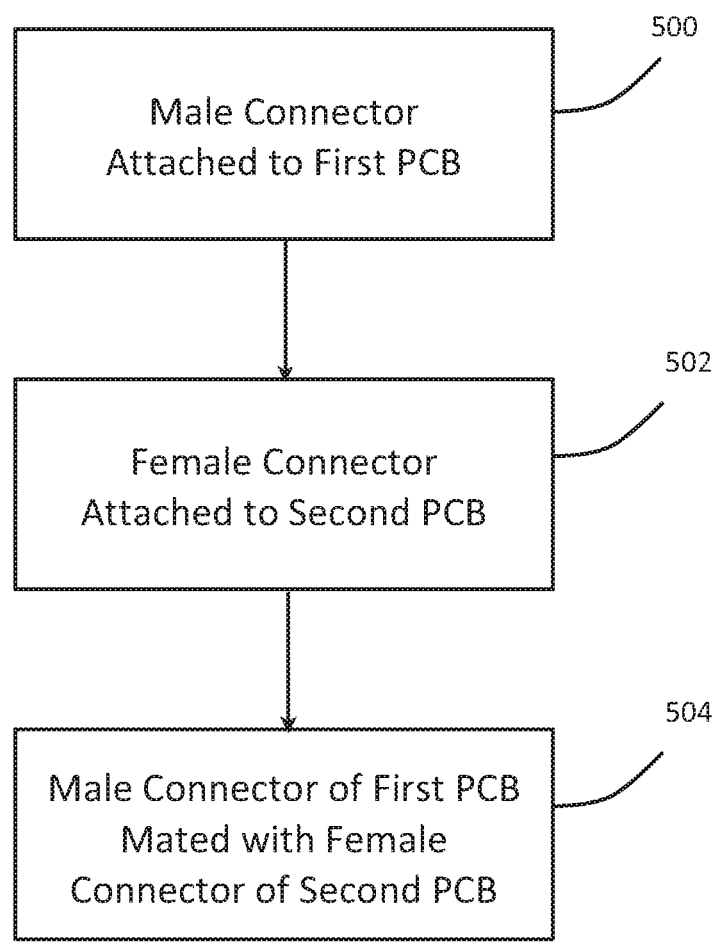
FIG. 5 shows a flowchart of one embodiment of a method for manufacturing a PLC.

FIG. 5 shows a flowchart of one embodiment of a method for manufacturing a PLC. The method may be performed to produce the PLC of FIGS. 1-4 or another PLC. The method is implemented in the order shown, but other orders may be used. Additional, different, or fewer acts may be provided. Similar methods may be used for manufacturing a PLC.

In act 500, a male connector is attached to a surface of a first PCB, such that the male connector is in electrical communication with the first PCB. The male connector includes a housing and a spring loaded pin connector disposed in the housing. The spring loaded pin connector may be one of a plurality of spring loaded pin connectors disposed in the housing. The spring loaded pin connector may be fixed to the housing of the male connector, or the spring loaded pin connector may be friction fit with an opening through the housing. The spring loaded pin connector includes a spring, a pin housing (e.g., a barrel), and a pin. A portion of the pin and all or most of the spring remain housed within the barrel over the course of operation of the spring loaded pin connector. The pin abuts an end of the spring, and the spring is operable to move the pin from a depressed position relative to the housing.

The male connector is attached to the surface of the first PCB in any number of ways including, for example, soldering a part of the spring loaded pin connector (e.g., the pin housing) to a pad of the first PCB. The housing of the male connector may also be attached to the surface of the PCB using, for example, an adhesive or a fastener (e.g., a screw).

The first PCB may be positioned in a first module (e.g., a housing of a first module). The first PCB may be positioned vertically or horizontally within the first module. The housing of the first module may be removably attached to a rail extending through at least a portion of the PLC. In one embodiment, the first module may be slidably attached to the rail extending through the portion of the PLC.

In act 502, a female connector is attached to a surface of a second PCB, such that the female connector is in electrical communication with the second PCB. The female connector includes a receptacle. In one embodiment, the female connector also includes a housing, in which the receptacle is disposed. The receptacle may be one of a plurality of receptacles disposed in the housing. The receptacle includes an opening extending at least partially through the receptacle.

The female connector is attached to the surface of the second PCB in any number of ways including, for example, soldering a part of the receptacle (e.g., one end of the receptacle) to a pad of the second PCB. The housing of the female connector, if provided, may also be attached to the surface of the second PCB using, for example, an adhesive or a fastener (e.g., a screw).

The second PCB may be positioned in a second module (e.g., a housing of a second module). The second PCB may be positioned vertically or horizontally within the second module. The housing of the second module may be removably attached to the rail extending through at least a portion of the PLC. In one embodiment, the second module may be slidably attached to the rail extending through the portion of the PLC.

In act 504, the male connector of the first PCB is mated with the female connector of the second PCB such that the pin of the spring loaded pin connector of the male connector moves into the opening extending through the receptacle of the female connector. The mating of the male connector of the first PCB with the female connector of the second PCB may include sliding the first module including the first PCB along the rail of the PLC relative to the second module including the second PCB, or sliding the second module along the rail relative to the first module until the connection between the male connector and the female connector is made. The first module and the second module may each include locking mechanisms, detents, or limiters to fix a relative distance between the first module and the second module once the connection between the male connector and the female connector is made.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A module for a programmable logic controller (PLC), the module-comprising:
   a printed circuit board (PCB) of the PLC, the PCB comprising two opposing sides;
   a first connector assembly supported by one of the two opposing sides of the PCB, the first connector assembly comprising a housing and a spring loaded pin connector disposed in the housing; and
   a second connector assembly supported by the other of the two opposing sides of the PCB, the second connector assembly comprising a female connector comprising a receptacle,
   wherein at least part of the spring loaded pin connector is in electrical communication with at least part of the female connector via the PCB, and
   wherein a part of the spring loaded pin connector and a part of the receptacle are soldered to pads of the PCB.

2. The module of claim 1, wherein the spring loaded pin connector comprises a housing, a pin, and a spring, the pin comprising a flange at one end of the pin,
   wherein one or more walls of the housing of the spring loaded pin connector define an opening that extends through the housing of the spring loaded pin connector, the opening having a smaller diameter at a first end of the housing than a second end of the housing, such that the flange of the pin and the spring remain entirely positioned in the opening extending through the housing of the spring loaded pin connector,
wherein a first end of the spring abuts the flange of the pin, such that in an extended position of the spring, the flange of the pin is adjacent to the first end of the housing of the spring loaded pin connector, and a second end of the spring abuts a pad of the PCB.

3. The module of claim 2, wherein the spring is compressible via a force applied to the pin, such that the pin is movable within the housing of the spring loaded pin connector.

4. The module of claim 2, wherein the spring is a coil spring.

5. The module of claim 1, wherein the pin and the spring are made of gold-plated copper.

6. The module of claim 1, wherein the first connector assembly comprises a plurality of spring loaded pin connectors disposed in the housing of the first connector assembly, the plurality of spring loaded pin connectors comprising the spring loaded pin connector.

7. The module of claim 6, wherein the plurality of spring loaded pin connectors are positioned in two or more rows in the housing of the first connector assembly.

8. The module of claim 1, wherein an opening through the receptacle is sized and shaped to match the size and shape of the pin of the spring loaded pin connector, and wherein the receptacle abuts a pad of the PCB.

9. The module of claim 8, wherein the second connector assembly further comprises a housing, and wherein the receptacle is disposed in the housing of the second connector assembly.

10. The module of claim 8, wherein the receptacle is made of gold plated copper.

11. The module of claim 8, wherein the first connector assembly comprises a plurality of spring loaded pin connectors disposed in the housing of the first connector assembly, the plurality of spring loaded pin connectors comprising the spring loaded pin connector,
wherein the female connector comprises a plurality of receptacles, the plurality of receptacles comprising the receptacle, and
wherein the number of spring loaded pin connectors is the same as the number of receptacles.

12. A controller comprising:
a first module comprising:
a first printed circuit board (PCB) comprising two opposing sides; and
a male connector supported by one of the two opposing sides of the first PCB, the male connector comprising a housing and a spring loaded pin connector disposed in the housing, the spring loaded pin connector comprising a spring and a pin, the pin abutting an end of the spring, the spring being operable to move the pin relative to the housing of the male connector; and
a second module comprising:
a second PCB comprising two opposing sides; and
a female connector supported by one of the two opposing sides of the second PCB, the female connector comprising a receptacle, the receptacle comprising an opening extending at least partially through the receptacle,
wherein a portion of the pin of the spring loaded pin connector of the first module is sized and shaped such that the pin is mateable with the receptacle.

13. The controller of claim 12, wherein power signals, data signals, or the power signals and the data signals are transmittable between the first PCB and the second PCB via the receptacle, the pin and the spring.

14. The controller of claim 12, further comprising a rail, wherein the first module and the second module are slidably attached to the rail, such that the male connector is movable into the female connector.

15. The controller of claim 12, wherein the second module further comprises a central processing unit supported by the second PCB and in electrical communication with the first PCB via the female connector of the second PCB and the male connector of the first PCB.

16. The controller of claim 12, wherein the female connector of the second module is a first female connector, and
wherein the first module further comprises a second female connector the second female connector being supported by the other of the two opposing sides of the first PCB and being in electrical communication with the male connector via the first PCB, and
wherein the second female connector comprises a receptacle, the receptacle comprising an opening extending at least partially through the second female connector.

17. The controller of claim 12, wherein the first module is an input/output (I/O) module.

18. A method of manufacturing a programmable logic controller (PLC), the method comprising:
attaching a male connector to a surface of a first printed circuit board (PCB), such that the male connector is in electrical communication with the first PCB, the male connector comprising a housing and a spring loaded pin connector disposed in the housing, the spring loaded pin connector comprising a spring and a pin, the pin abutting an end of the spring, the spring operable to move the pin relative to the housing;
attaching a female connector to a surface of a second PCB, such that the female connector is in electrical communication with the second PCB, the female connector comprising a receptacle, the receptacle comprising an opening extending at least partially through the receptacle; and
positioning the male connector of the first PCB and the female connector of the second PCB relative to each other such that the pin of the spring loaded pin connector of the male connector moves into the opening extending through the receptacle of the female connector.

19. The method of claim 18, wherein the attaching of the male connector to the surface of the first PCB comprises soldering a part of the spring loaded pin connector to a pad of the first PCB, and
wherein the attaching of the female connector to the surface of the second PCB comprises soldering a portion of the receptacle to a pad of the second PCB.

20. The method of claim 18, wherein the positioning comprises sliding the first PCB along a rail of the PLC relative to the second PCB, or sliding the second PCB along the rail of the PLC relative to the first PCB, the first PCB and the second PCB being slidably attached to the rail.

\* \* \* \* \*